United States Patent [19]
Lucas

[11] Patent Number: 5,434,534
[45] Date of Patent: Jul. 18, 1995

[54] CMOS VOLTAGE REFERENCE CIRCUIT

[75] Inventor: Charles H. Lucas, Fair Oaks, Calif.

[73] Assignee: Intel Corporation, Santa Clara, Calif.

[21] Appl. No.: 158,418

[22] Filed: Nov. 29, 1993

[51] Int. Cl.$^6$ .............................................. H03K 3/01
[52] U.S. Cl. ..................... 327/546; 327/545;
327/540; 327/541; 327/543
[58] Field of Search ................ 323/312, 313;
307/296.6, 296.8; 327/538, 540, 541, 543, 545, 546

[56] References Cited

U.S. PATENT DOCUMENTS

| | | | |
|---|---|---|---|
| 4,812,735 | 3/1989 | Sawada et al. | 307/296.8 |
| 5,083,079 | 1/1992 | Plants | 307/296.8 |
| 5,109,187 | 4/1992 | Gulliani | 307/296.6 |

Primary Examiner—Timothy P. Callahan
Assistant Examiner—Jung Ho Kim
Attorney, Agent, or Firm—Blakely, Sokoloff, Taylor & Zafman

[57] ABSTRACT

A simple CMOS voltage reference circuit develops a reference voltage from the sum of the threshold voltages of a pair of complementary devices. In a p-type substrate a p-channel device is formed in an isolated n-type well, with the well tied to the source at the reference node. The drain is coupled to the drain of a complementary n-channel device. An additional p-channel device functions as a current source. The voltage reference circuit may be advantageously cascaded to improve stability and insensitivity to the power supply voltage.

21 Claims, 2 Drawing Sheets

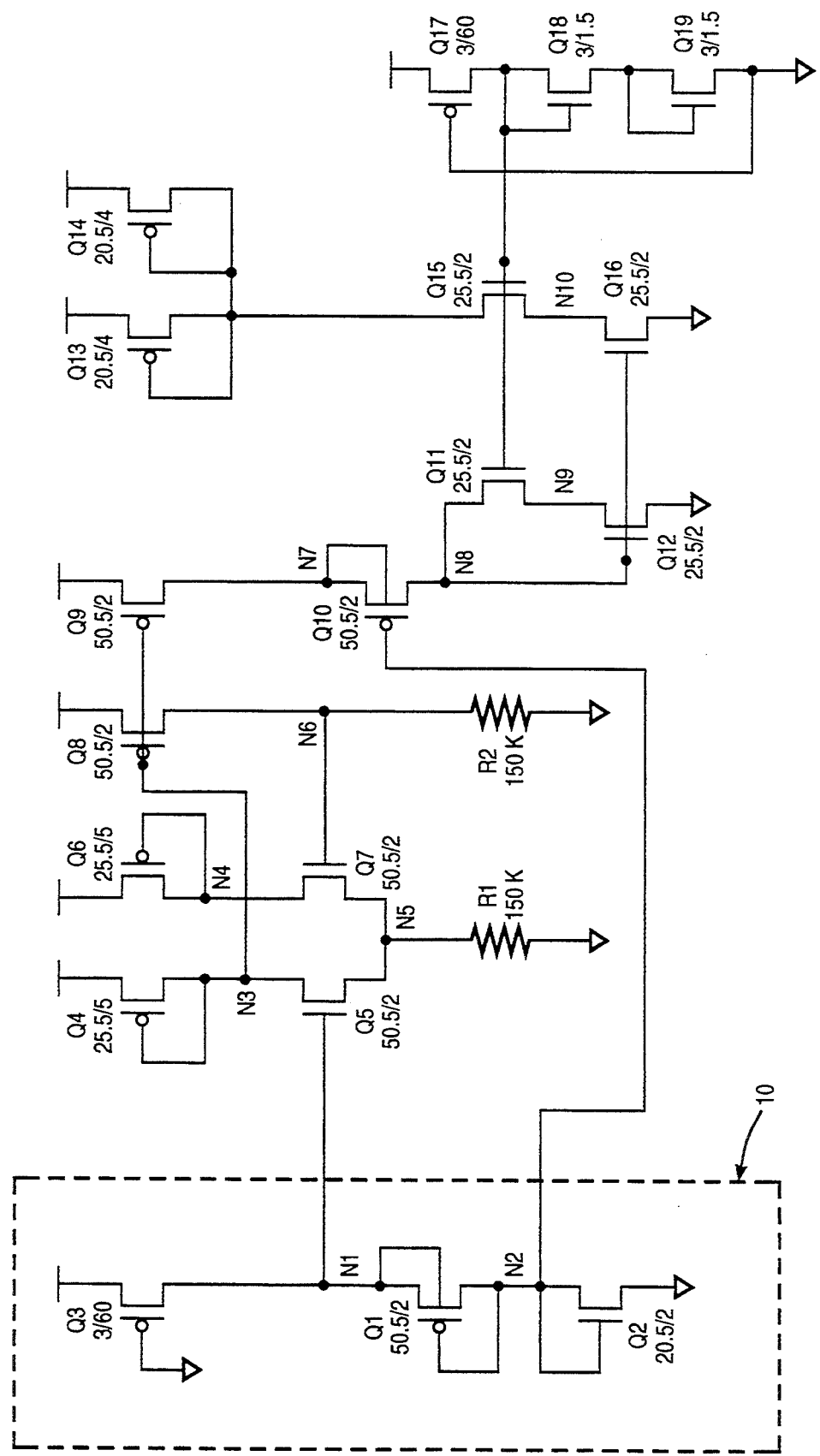
FIG_1

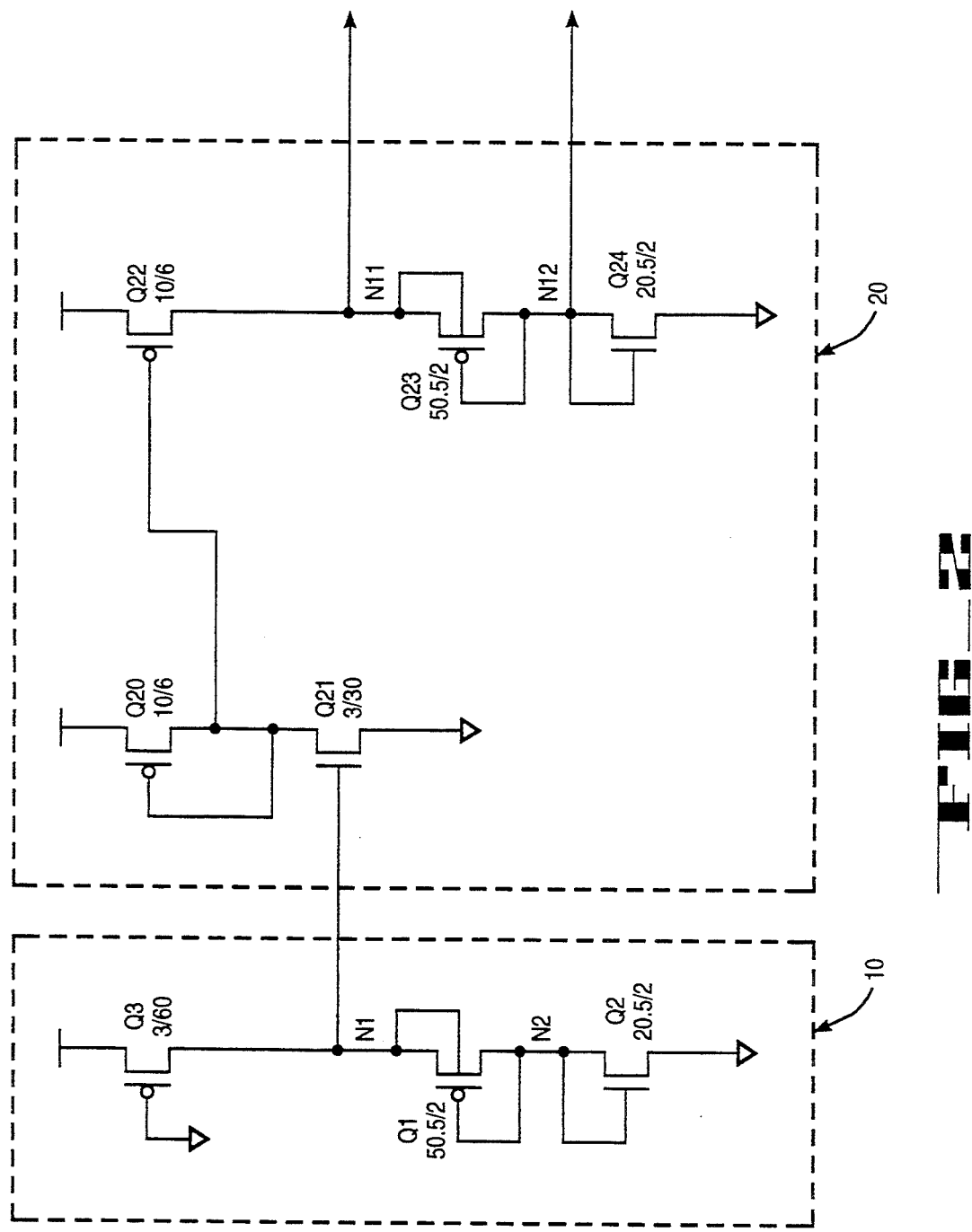
FIG_2

CMOS VOLTAGE REFERENCE CIRCUIT

BACKGROUND OF THE INVENTION

1. Field of the Invention

This invention relates to the field of voltage reference circuits, and particularly to a voltage reference circuit fabricated with complementary metal oxide semiconductor (CMOS) devices.

2. Background Art

In the design of large scale integrated circuits, it is often necessary to provide a local reference voltage of a known value that remains stable with both temperature and process variations. A common prior art approach is a bandgap reference circuit. Such circuits develop a stable reference voltage that is approximately equal to, or a ratio of, the bandgap voltage of silicon (i.e., about 1.2 volts). Bandgap reference circuits are noted for their stability, but are generally implemented with bipolar devices and are relatively complicated, particularly if it is necessary to operate over a wide swing in the power supply voltage.

Five volt power supplies, which have long been the standard for bipolar transistor circuitry, have also been widely used for CMOS circuitry. However, there has been a growing trend toward the use of lower voltage supplies for CMOS devices. Typically, these provide power at approximately 3 volts. In view of this trend to lower voltage power supplies, it is desirable to design new CMOS devices so that they are capable of operating over a wide range of power supply voltages.

SUMMARY OF THE INVENTION

The present invention provides a simple CMOS voltage reference circuit. The reference voltage is developed from the sum of the threshold voltages of a pair of complementary field effect transistor (FET) devices. In a particular embodiment of the invention, the voltage reference circuit is fabricated in a p-type silicon substrate. A p-channel FET is fabricated in an isolated n-type well, with the well tied to the source electrode. The drain electrode is coupled to the drain electrode of a complementary n-channel FET whose source electrode is coupled to ground. An additional p-channel FET is coupled to the positive rail of the power supply and acts as a current source for the complementary pair of FETs. The reference voltage, approximately equal to the sum of the threshold voltages above ground, is developed at the source electrode of the p-channel device and is relatively stable over process, temperature and power supply variations.

The equivalent circuit may be fabricated in an n-type substrate by using complementary devices. In such case, the reference voltage is preferably developed with respect to the positive rail of the power supply.

BRIEF DESCRIPTION OF THE DRAWINGS

FIG. 1 is a schematic circuit diagram of a current generator circuit employing the voltage reference circuit of the present invention.

FIG. 2 is a schematic circuit diagram of a cascaded voltage reference circuit.

DETAILED DESCRIPTION OF THE INVENTION

In the following description, for purposes of explanation and not limitation, specific details are set forth in order to provide a thorough understanding of the present invention. However, it will be apparent to one skilled in the art that the present invention may be practiced in other embodiments that depart from these specific details. In some instances, detailed descriptions of well-known methods, devices and circuits are omitted so as to not obscure the description of the present invention with unnecessary detail.

FIG. 1 illustrates a voltage reference circuit according to the present invention as used in a current generator circuit. The voltage reference circuit 10 comprises MOSFETs Q1, Q2 and Q3 and provides a reference voltage output at node N1. The circuit of the illustrated embodiment is formed in a p-type substrate; however, by complementing the various devices, a functionally identical circuit may be formed in an n-type substrate.

Q1 is a p-channel device fabricated in an isolated n-type well. The well for Q1 is conductively connected to the source electrode of the device. Q2 is an n-channel device having its drain connected to the drain of Q1 at node N2. The gate electrodes of both Q1 and Q2 are coupled to node N2. The source electrode of Q2 is tied to the ground rail of the power supply.

The current source for node N1 is provided by p-channel device Q3. The source electrode of Q3 is coupled to the positive rail of the power supply, which may be anywhere within the range of approximately 3 to 5 volts. The gate electrode of Q3 is tied to ground potential to maintain Q3 in a forward biased condition.

Dimensions of the various circuit devices are included in FIG. 1 using conventional notation. Thus, for example, the source and drain regions of Q3 have a width of approximately 3 microns and a channel length of approximately 60 microns. The long, narrow configuration of Q3 make it appear to the circuit essentially as a resistor for supplying current to Q 1 and Q2. The width of Q1 is approximately 50.5 microns, whereas the width of Q2 is approximately 20.5 microns. Both devices have a channel length of approximately 2 microns. The Q1:Q2 ratio of width should be approximately 2.5:1 as indicated.

At the supply voltages of interest, namely, 3–5 volts, Q1 and Q2 operate just below threshold. The voltage at node N1 is approximately equal to the sum of the n and p thresholds, which are relatively independent of the power supply voltage. This sum of the complementary thresholds typically varies less than either of the constituents, both with process and temperature. The voltage at node N1 thus provides a relatively stable reference voltage, although not as stable as a bandgap circuit. In the circuit illustrated, the voltage at node N1 varies from approximately 1.5 volts at a supply voltage of 2 volts to approximately 1.8 volts at a supply voltage of 5 volts.

The reference voltage developed at node N1 is supplied to the gate electrode of Q5, thereby buffering node N1 from any significant current draw. The voltages at nodes N3 and N4 are approximately equal so that node N6 is held at approximately the same voltage as node N1. The current supplied to node N6 is equal to the reference voltage divided by the resistance of R2 which, in the illustrated embodiment, is a 150 k well resistor.

The voltage at node N2 is supplied to the gate of Q 10 and causes the voltage at node N7 to track the voltage at node N6. The currents through nodes N6 and N7 are thereby matched and are essentially independent of the supply voltage.

Although the voltage reference circuit 10 is shown in combination with a current generator circuit, this is but an exemplary application of the present invention. The voltage at node N1 may be employed as a reference voltage for virtually any circuit or device, provided that the node is suitably buffered.

The basic voltage reference circuit of the present invention may be cascaded in stages as illustrated in FIG. 2. Reference circuit 10 is identical to that described above. A second circuit stage 20 has been added so that the reference voltage is now provided at node N11. As is apparent from the figure, FETs Q23 and Q24 are identical to FETs Q1 and Q2, respectively. The current sourcing function of Q3 in circuit 10 is accomplished in the second circuit stage 20 by a current mirror comprising FETs Q20 and Q22 driven from node N1 by Q21. A cascaded arrangement as shown in FIG. 2 provides greater stability and greater insensitivity to the power supply voltage than a single stage circuit as shown in FIG. 1, albeit at the cost of somewhat greater complexity.

Although the present invention has been described in terms of preferred embodiments, it will be appreciated that various modifications and alterations might be made by those skilled in the art without departing from the spirit and scope of the invention. The invention should, therefore, be measured in terms of the claims which follow.

What is claimed is:

1. A voltage reference circuit formed in a semiconductor substrate of a first conductivity type, the voltage reference circuit comprising:
   (a) a first voltage terminal;
   (b) a second voltage terminal;
   (c) a first transistor of a first channel type formed in an isolated well in the substrate, wherein the isolated well is of a second conductivity type and is conductively coupled to a first node,
      the first transistor having a first channel electrode directly coupled to the first node, a second channel electrode coupled to a second node, and a gate electrode coupled to the second node;
   (d) a second transistor of a second channel type, the second transistor having a first channel electrode coupled to the second node, a second channel electrode coupled to the second voltage terminal, and a gate electrode coupled to the second node;
   (e) a third voltage terminal; and
   (f) a third transistor having a first channel electrode coupled to the first voltage terminal, a second channel electrode directly coupled to the first node, and a gate electrode coupled to the third voltage terminal for conducting current between the first channel electrode of the third transistor and the second channel electrode of the third transistor.

2. A voltage reference circuit formed in a semiconductor substrate of a first conductivity type, the voltage reference circuit comprising:
   (a) a first voltage terminal coupled to a first node;
   (b) a second voltage terminal;
   (c) a first transistor of a first channel type formed in a first isolated well in the substrate, wherein the first isolated well is of a second conductivity type and is conductively coupled to the first node,
      the first transistor having a first channel electrode coupled to the first node, a second channel electrode coupled to a second node, and a gate electrode coupled to the second node;
   (d) a second transistor of a second channel type, the second transistor having a first channel electrode coupled to the second node, a second channel electrode coupled to the second voltage terminal, and a gate electrode coupled to the second node;
   (e) a third voltage terminal coupled to a third node;
   (f) a fourth voltage terminal;
   (g) a third transistor of the first channel type formed in a second isolated well in the substrate, wherein the second isolated well is of the second conductivity type and is conductively coupled to the third node,
      the third transistor having a first channel electrode coupled to the third node, a second channel electrode coupled to a fourth node, and a gate electrode coupled to the fourth node;
   (h) a fourth transistor of the second channel type, the fourth transistor having a first channel electrode coupled to the fourth node, a second channel electrode coupled to the fourth voltage terminal, and a gate electrode coupled to the fourth node; and
   (i) a current source coupled to the third node and to the first voltage terminal for providing current at the first node.

3. The voltage reference circuit of claim 2, wherein the current source comprises a current mirror coupled between the first node and the third node.

4. A method for providing a voltage reference circuit formed in a semiconductor substrate of a first conductivity type, the method comprising the steps of:
   (a) providing a first voltage terminal
   (b) providing a second voltage terminal;
   (c) providing a first transistor of a first channel type formed in an isolated well in the substrate, wherein the isolated well is of a second conductivity type and is conductively coupled to a first node,
      the first transistor having a first channel electrode directly coupled to the first node, a second channel electrode coupled to a second node, and a gate electrode coupled to the second node;
   (d) providing a second transistor of a second channel type, the second transistor having a first channel electrode coupled to the second node, a second channel electrode coupled to the second voltage terminal, and a gate electrode coupled to the second node;
   (e) providing a third voltage terminal; and
   (f) providing a third transistor having a first channel electrode coupled to the first voltage terminal, a second channel electrode directly coupled to the first node, and a gate electrode coupled to the third voltage terminal for conducting current between the first channel electrode of the third transistor and the second channel electrode of the third transistor.

5. The method of claim 4, wherein the first conductivity type is p-type, the second conductivity type is n-type, the first channel type is p-type, and the second channel type is n-type.

6. A method for providing a voltage reference circuit formed in a semiconductor substrate of a first conductivity type, the method comprising the steps of:
   (a) providing a first voltage terminal coupled to a first node;
   (b) providing a second voltage terminal;

(c) providing a first transistor of a first channel type formed in a first isolated well in the substrate, wherein the first isolated well is of a second conductivity type and is conductively coupled to the first node, the first transistor having a first channel electrode coupled to the first node, a second channel electrode coupled to a second node, and a gate electrode coupled to the second node;

(d) providing a second transistor of a second channel type, the second transistor having a first channel electrode coupled to the second node, a second channel electrode coupled to the second voltage terminal, and a gate electrode coupled to the second node;

(e) providing a third voltage terminal coupled to a third node;

(f) providing a fourth voltage terminal;

(g) providing a third transistor of the first channel type formed in a second isolated well in the substrate, wherein the second isolated well is of the second conductivity type and is conductively coupled to the third node, the third transistor having a first channel electrode coupled to the third node, a second channel electrode coupled to a fourth node, and a gate electrode coupled to the fourth node;

(h) providing a fourth transistor of the second channel type, the fourth transistor having a first channel electrode coupled to the fourth node, a second channel electrode coupled to the fourth voltage terminal, and a gate electrode coupled to the fourth node; and (i) providing a current source coupled to the third node and to the first voltage terminal for providing current at the first node.

7. The method of claim 6, wherein the current source comprises a current mirror coupled between the first node and the third node.

8. An integrated circuit formed in a semiconductor substrate of a first conductivity type, the integrated circuit comprising:

(a) a first voltage terminal;

(b) a second voltage terminal;

(c) a first transistor of a first channel type formed in an isolated well in the substrate, wherein the isolated well is of a second conductivity type and is conductively coupled to a first node, the first transistor having a first channel electrode directly coupled to the first node, a second channel electrode coupled to a second node, and a gate electrode coupled to the second node;

(d) a second transistor of a second channel type, the second transistor having a first channel electrode coupled to the second node, a second channel electrode coupled to the second voltage terminal, and a gate electrode coupled to the second node;

(e) a circuit coupled to the first node;

(f) a third voltage terminal; and (g) a third transistor having a first channel electrode coupled to the first voltage terminal, a second channel electrode directly coupled to the first node, and a gate electrode coupled to the third voltage terminal for conducting current between the first channel electrode of the third transistor and the second channel electrode of the third transistor.

9. The integrated circuit of claim 8, wherein the first conductivity type is p-type, the second conductivity type is n-type, the first channel type is p-type, and the second channel type is n-type.

10. The integrated circuit of claim 8, wherein the circuit coupled to the first node comprises a current generator circuit.

11. An integrated circuit formed in a semiconductor substrate of a first conductivity type, the integrated circuit comprising:

(a) a first voltage terminal coupled to a first node;

(b) a second voltage terminal;

(c) a first transistor of a first channel type formed in a first isolated well in the substrate, wherein the first isolated well is of a second conductivity type and is conductively coupled to the first node, the first transistor have a first channel electrode coupled to the first node, a second channel electrode coupled to a second node, and a gate electrode coupled to the second node;

(d) a second transistor of a second channel type, the second transistor having a first channel electrode coupled to the second node, a second channel electrode coupled to the second voltage terminal, and a gate electrode coupled to the second node;

(e) a circuit coupled to the first node;

(f) a third voltage terminal coupled to a third node;

(g) a fourth voltage terminal;

(h) a third transistor of the first channel type formed in a second isolated well in the substrate, wherein the second isolated well is of the second conductivity type and is conductively coupled to the third node, the third transistor having a first channel electrode coupled to the third node, a second channel electrode coupled to a fourth node, and a gate electrode coupled to the fourth node;

(i) a fourth transistor of the second channel type, the fourth transistor having a first channel electrode coupled to the fourth node, a second channel electrode coupled to the fourth voltage terminal, and a gate electrode coupled to the fourth node; and (j) a current source coupled to the third node and to the first voltage terminal for providing current at the first node.

12. The integrated circuit of claim 11, wherein the current source comprises a current mirror coupled between the first node and the third node.

13. The voltage reference circuit of claim 11, wherein the first conductivity type is p-type, the second conductivity type is n-type, the first channel type is p-type, and the second channel type is n-type.

14. The voltage reference circuit of claim 13 wherein the first transistor is approximately 2.5 times greater in width than the second transistor.

15. A voltage reference circuit formed in a semiconductor substrate of a first conductivity type, the voltage reference circuit comprising:

(a) a first voltage terminal coupled to a first node;

(b) a second voltage terminal;

(c) a first transistor of a first channel type formed in a first isolated well in the substrate, wherein the first isolated well is of a second conductivity type and is conductively coupled to the first node, the first transistor having a first channel electrode coupled to the first node, a second channel electrode coupled to a second node, and a gate electrode coupled to the second node;

(d) a first diode element coupled between the second node and the second voltage terminal;
(e) a third voltage terminal coupled to a third node;
(f) a fourth voltage terminal;
(g) a second transistor of the first channel type formed in a second isolated well in the substrate, wherein the second isolated well is of the second conductivity type and is conductively coupled to the third node,
the second transistor having a first channel electrode coupled to the third node, a second channel electrode coupled to a fourth node, and a gate electrode coupled to the fourth node;
(h) a second diode element coupled between the fourth node and the fourth voltage terminal; and
(i) a current source coupled to the third node and to the first voltage terminal for providing current at the first node.

16. The voltage reference circuit of claim 15, wherein the first diode element comprises a third transistor of a second channel type, the third transistor having a first channel electrode coupled to the second node, a second channel electrode coupled to the second voltage terminal, and a gate electrode coupled to the second node.

17. The voltage reference circuit of claim 15, wherein the second diode element comprises a third transistor of a second channel type, the third transistor having a first channel electrode coupled to the fourth node, a second channel electrode coupled to the fourth voltage terminal, and a gate electrode coupled to the fourth node.

18. The voltage reference circuit of claim 15, wherein the current source comprises a current mirror coupled between the first node and the third node.

19. The voltage reference circuit of claim 15, wherein the first conductivity type is p-type, the second conductivity type is n-type, and the first channel type is p-type.

20. The voltage reference circuit of claim 15, further comprising:
(j) a circuit coupled to the first node.

21. The voltage reference circuit of claim 15, further comprising:
(j) a fifth voltage terminal; and
(k) a second current source coupled to the third voltage terminal for providing current at the third node,
the second current source comprising a third transistor having a first channel electrode coupled to the third voltage terminal, a second channel electrode coupled to the third node, and a gate electrode coupled to the fifth voltage terminal for conducting current between the first channel electrode of the third transistor and the second channel electrode of the third transistor.

* * * * *

UNITED STATES PATENT AND TRADEMARK OFFICE
CERTIFICATE OF CORRECTION

PATENT NO.   : 5,434,534
DATED        : July 18, 1995
INVENTOR(S)  : Charles H. Lucas It is certified that error appears in the above-identified patent and that said Letters Patent is hereby corrected as shown below:

Column 2, line 20:
    delete "beth" and insert --both--

Column 6, line 17:
    delete "have" and insert --having--

Column 6, line 49:
    delete "claim 11" and insert --claim 1--

Signed and Sealed this

Eighteenth Day of March, 1997

Attest:

BRUCE LEHMAN

Attesting Officer     Commissioner of Patents and Trademarks